(12) United States Patent
Mendes et al.

(10) Patent No.: US 10,141,905 B2
(45) Date of Patent: Nov. 27, 2018

(54) AMPLIFIER WITH ADJUSTMENT OF THE AUTOMATIC SOUND LEVEL

(71) Applicant: DEVIALET, Paris (FR)

(72) Inventors: Eduardo Mendes, Chabeuil (FR); Julien Bergére, Hong Kong (HK); Pierre-Emmanuel Calmel, Le Chesnay (FR)

(73) Assignee: DEVIALET, Paris (FR)

( * ) Notice: Subject to any disclaimer, the term of this patent is extended or adjusted under 35 U.S.C. 154(b) by 0 days.

(21) Appl. No.: 15/544,772

(22) PCT Filed: Jan. 19, 2016

(86) PCT No.: PCT/EP2016/051029
§ 371 (c)(1),
(2) Date: Jul. 19, 2017

(87) PCT Pub. No.: WO2016/116453
PCT Pub. Date: Jul. 28, 2016

(65) Prior Publication Data
US 2018/0097496 A1    Apr. 5, 2018

(30) Foreign Application Priority Data

Jan. 19, 2015  (FR) ...................................... 15 50405

(51) Int. Cl.
*H03G 7/00* (2006.01)
*H04R 3/00* (2006.01)

(52) U.S. Cl.
CPC .............. *H03G 7/002* (2013.01); *H03G 7/007* (2013.01)

(58) Field of Classification Search
CPC .......... H03G 7/00; H03G 7/001; H03G 7/002; H03G 7/005; H03G 7/007; H03G 9/005;
(Continued)

(56) References Cited

U.S. PATENT DOCUMENTS

| 4,466,119 A | * | 8/1984 | Peters | ..................... | H03G 9/025 330/136 |
| 5,130,665 A | * | 7/1992 | Walden | ..................... | H03G 3/04 330/129 |

(Continued)

OTHER PUBLICATIONS

Stone Michael A et al: "Effect of the speed of a single-channel dynamic range compressor on intelligibility in a competing speech task", The Journal of the Acoustical Society of America, American Institute of Physics for the Acoustical Society of America, New York, NY, US, vol. 114, No. 2, Aug. 1, 2003(Aug. 1, 2003), pp. 1023-1034, XP012003584, ISSN: 0001-4966, DOI: 10.1121/1. 1592160 Chapter 2. "Slow" compressor.

(Continued)

*Primary Examiner* — Thang V Tran
(74) *Attorney, Agent, or Firm* — B. Aaron Schulman, Esq.; Stites & Harbison, PLLC

(57) ABSTRACT

A method is provided for producing a volume gain applied by an amplifier to at least one audio signal according to a desired volume gain selected by a user, which includes calculating a standardized total slow sound level from at least one audio signal, calculating maximum slow volume gain and minimum slow volume gain as the quotient of the product of the desired volume gain by maximum slow gain, respectively by minimum slow gain, divided by the standardized total slow sound level, determining a first minimum out of the desired volume gain and the maximum slow volume gain, determining a second minimum out of the desired volume gain multiplied by a maximum volume gain and the minimum slow volume gain, determining as a slow volume gain the maximum of the first and second previously determined minima, and calculating the volume gain according to the slow volume gain.

11 Claims, 2 Drawing Sheets

Figure 1:
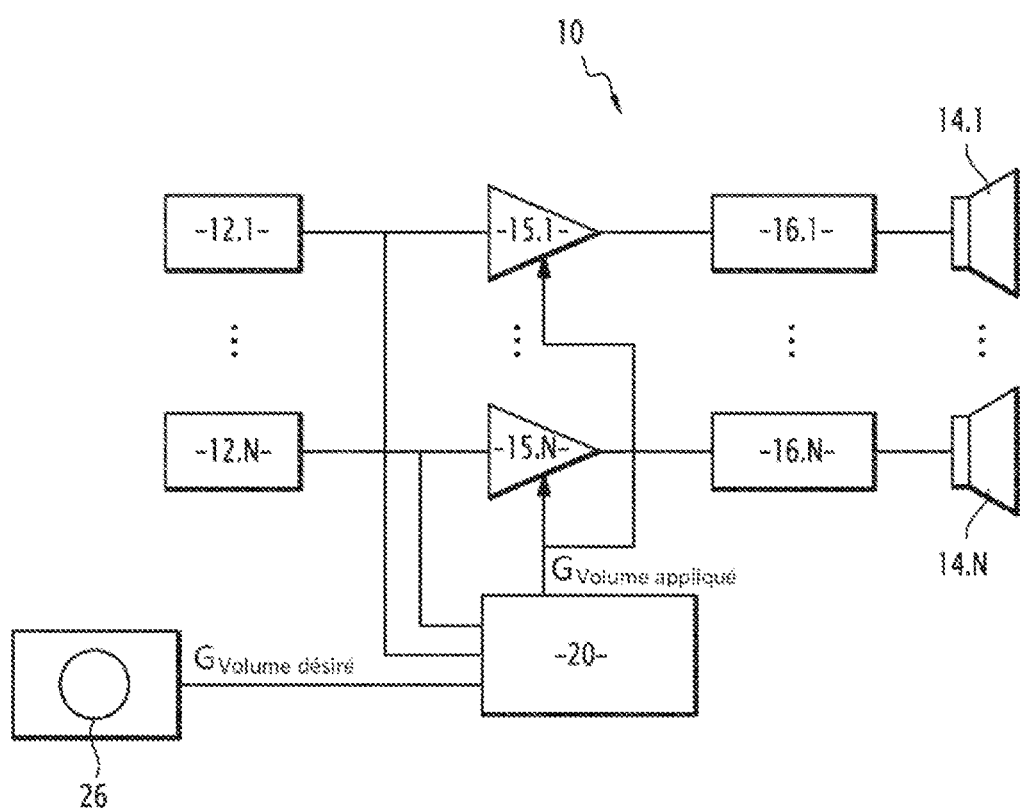

(58) Field of Classification Search
CPC ...... H03G 9/025; H03G 5/165; H03G 11/008; H04R 3/00; H04R 2430/00; H04R 2430/01; G06F 3/165; G06F 3/181
See application file for complete search history.

(56) References Cited

U.S. PATENT DOCUMENTS

| | | | |
|---|---|---|---|
| 5,666,430 A | 9/1997 | Rzeszewski | |
| 6,195,438 B1 | 2/2001 | Yumoto et al. | |
| 2005/0276426 A1* | 12/2005 | Ono | H04H 60/04 381/104 |
| 2007/0223738 A1* | 9/2007 | North | H03G 3/001 381/104 |
| 2008/0013751 A1* | 1/2008 | Hiselius | H03G 9/005 381/102 |
| 2008/0056504 A1 | 3/2008 | Gorges et al. | |
| 2008/0063220 A1* | 3/2008 | Lin | H03G 3/001 381/120 |
| 2008/0089535 A1* | 4/2008 | Hong | H03G 3/002 381/109 |
| 2012/0014538 A1* | 1/2012 | Bozkurt | H03G 3/001 381/107 |
| 2014/0369527 A1 | 12/2014 | Baldwin | |

OTHER PUBLICATIONS

Stone Michael A et al: "Comparison of different forms of compression using wearable digital hearing aids", The Journal of the Acoustical Society of America, American Institute of Physics for the Acoustical Society of America, New York, NY, US, vol. 106, No. 6, Dec. 1, 1999(Dec. 1, 1999), pp. 3603-3619, XP012001391, ISSN: 0001-4966, DOI: 10.1121/1.428213 abstract; figure 2 Chapter I.A.
Preliminary Search Report for FR 1550405, completed Dec. 22, 2015.
International Search Report for PCT/EP2016/051029, completed Apr. 4, 2016.

* cited by examiner

AMPLIFIER WITH ADJUSTMENT OF THE AUTOMATIC SOUND LEVEL

The present invention relates to a method for adapting the volume gain to be applied by an amplifier to at least one audio signal to be reproduced, according to the desired volume gain selected by a user.

Audio broadcasting systems use very different audio sources having very different contents (music, speech, miscellaneous sounds). The sound level broadcasted by an audio system depends both on the audio signals that are reproduced by the broadcasting system and the desired volume gain selected by the user and adjusted manually on the amplifier. At a constant desired volume gain, depending on the audio signals to be broadcast, the perceived sound level may be very different. The user is constantly required to modify the desired volume gain so as to keep the perceived sound level within the desired limits, in particular when listening to a movie soundtrack with frequent rhythm changes between action scenes and dialogue scenes.

In the literature, the proposed methods aim to keep the average sound level constant with a constant desired volume gain irrespective of the audio signals to be reproduced.

These correction mechanisms are known under the acronym AVL (auto-volume leveler).

Most of the methods of the state of the art modify the volume gain desired by the user by decreasing it or increasing it by a certain quantity.

Documents U.S. Pat. Nos. 5,666,430 and 6,195,438 describe methods for keeping the average sound level practically constant.

In the literature, mention is often made of artifacts introduced by the automatic gain systems (hunting, excessively high gains during periods of silence, etc.). These artifacts are decreased by adjusting the initiation and release times of the actions on the desired volume gain and establishing specific thresholds that are difficult to adjust.

In the state of the art, the mechanisms used are intended to keep the sound level constant, which completely distorts the musical content of a piece of music or, when listening to a movie, no longer differentiates between the sound level during calm dialogue or during an action scene.

The invention aims to propose an amplifier capable of maintaining the dynamics specific to the audio signals without imposing a practically constant average sound level, but allowing the sound level to change in pleasant proportions for the user.

To that end, the invention relates to an amplifier of the aforementioned type, characterized in that it includes the following steps:
- calculating a standardized total slow sound level from the at least one signal to be reproduced;
- calculating a maximum slow volume gain and a minimum slow volume gain as the quotient of the product of the desired volume gain by dividing a maximum slow gain or respectively a minimum slow gain by the standardized total slow sound level;
- determining a first minimum out of the desired volume gain and the maximum slow volume gain;
- determining a second minimum out of the desired volume gain multiplied by a maximum volume gain and the minimum slow volume gain;
- determining, as a slow volume gain, the maximum of the first and second previously determined minima;
- calculating the volume gain applied according to the slow volume gain.

The present invention primarily makes it possible to maintain the sound level between a low limit and a high limit in order to maintain the listening quality and the primary dynamics of the audio signal.

According to specific embodiments, the method for adapting the volume gain to be applied by an amplifier includes one or more of the following features:
- the step for calculating the standardized total slow sound level includes, for the or each audio signal to be reproduced, calculating a slow sound level specific to the audio signal, such as the average of the levels of the audio signal of each source over a long duration;
- the method includes at least two audio signals to be reproduced, and the standardized total slow sound level is a function of each of the slow sound levels;
- the long duration is greater than 1 second;
- the applied volume gain is the product of the slow volume gain multiplied by a peak volume gain having a value lower than or equal to 1 depending on fluctuations of the sound level of the or each sound signal over a short duration strictly shorter than the long duration;
- the calculation of the peak volume gain includes the following steps:
  - calculating a standardized total fast sound level from the at least one signal to be reproduced
  - calculating an expansion coefficient equal to the quotient of the product of the standardized total slow sound level multiplied by a maximum peak gain divided by the standardized total fast sound level
  - calculating the peak volume gain as the minimum of the expansion coefficient and the value 1.
- the step for calculating the standardized total fast sound level includes, for the or each audio signal to be reproduced, calculating a fast sound level specific to each audio signal, such as the average of the levels of the audio signal of the source over the short duration;
- the method includes at least two audio signals to be reproduced, and the standardized total fast sound level is a function of each of the fast sound levels;
- the short duration is less than 1 second;

The invention further relates to an amplifier including means for adapting the volume gain to at least one audio signal to be reproduced, according to the desired volume gain selected by a user, including:
- means for calculating a standardized total slow sound level from the at least one signal to be reproduced;
- means for calculating a maximum slow volume gain and a minimum slow volume gain as the quotient of the product of the desired volume gain by dividing a maximum slow gain or respectively a minimum slow gain by the standardized total slow sound level;
- means for determining a first minimum out of the desired volume gain and the maximum slow volume gain;
- means for determining a second minimum out of the desired volume gain multiplied by a maximum volume gain and the minimum slow volume gain;
- means for determining, as a slow volume gain, the maximum of the first and second previously determined minima;
- means for calculating the volume gain applied according to the slow volume gain.

Figure 2:
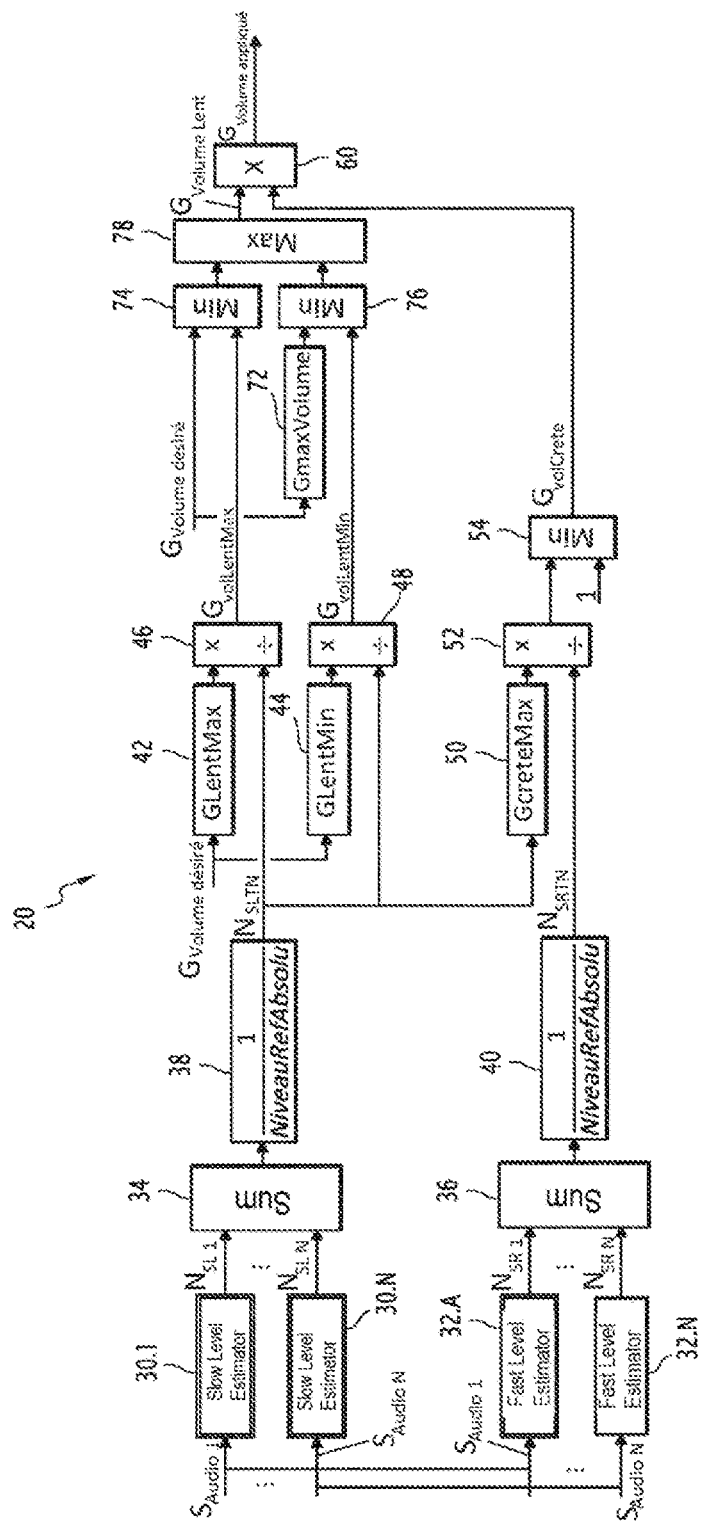

The invention will be better understood upon reading the following description, provided solely as an example and done in reference to the drawings, in which:

FIG. 1 is a schematic view of a sound retrieval installation according to the invention; and FIG. 2 is a block diagram of the method according to the invention for calculating the applied volume gain from the desired volume gain and the signals to be reproduced.

The sound retrieval installation 10 illustrated in FIG. 1 includes several modules 12.1 to 12.N for producing N audio signals, such as separate tracks of a digital recording.

Each module 12.1 to 12.N for producing an audio signal is connected to a loudspeaker 14.1 to 14.N through a unit 15.1 to 15.N for producing an applied volume gain denoted $G_{Volume\ appliqué}$ and the output of which is connected to a specific amplification unit 16.1 to 16.N.

Each unit for applying the applied volume gain 15.1 to 15.N is connected to a volume management unit 20 to receive the same applied volume gain $G_{Volume\ appliqué}$ to be applied to the signal received as input.

The volume management unit 20 is connected to a control member 26, such as a rotating potentiometer allowing the user to adjust a desired volume gain denoted $G_{Volume\ désiré}$ for the sound retrieval.

The structure of the volume management unit 20 is outlined in the form of a block diagram in FIG. 2.

The volume management unit 20 is connected to the output of the different sources 12.1 to 12.N to receive the audio signals denoted $S_{Audio\ 1} \ldots S_{Audio\ N}$.

For each audio signal, the volume management unit 20 includes a slow level estimator 30.1 to 30.N and a fast level estimator 32.1 to 32.1.

Each slow level estimator 30.1 to 30.N is able to calculate a variable representative of the average slow sound level, made up of the average of the sound levels over a long duration of several seconds, technically comprised between 1 and 10 seconds.

For example, each slow level estimator 30.1 to 30.N is able to calculate the effective RMS (Root Mean Square) speed of the audio signal during the selected duration, for example 5 seconds.

Advantageously, each audio signal $S_{Audio1}$ to $S_{Audio\ N}$ is processed in a weight filter adapted according to each source, in order to homogenize the sound levels perceived by the user. The filter is for example a loudness weight filter (weight A, B, C or D), which is a sort of physico-acoustic model of human hearing.

The slow sound level is designated by $N_{SL\ i}$ for the audio source $S_{audio\ i}$. Each fast level estimator 32.1 to 32.N is able to define an average sound level over a short duration, typically shorter than 1 second. This sound level is for example the effective value of the signal over a duration comprised between 0.1 and 1 second.

The fast sound level is designated by $N_{SR\ i}$ for the audio source $S_{audio\ i}$.

A summer 34, 36 is provided to sum the slow sound levels and the fast sound levels with one another, respectively.

The result of this sum is multiplied by the inverse of an absolute reference level NiveauRefAbsolu in blocks 38, 40, so as to obtain a standardized total slow sound level and a standardized total fast sound level. These are respectively denoted $N_{SLTN}$ and $N_{SRTN}$. They satisfy the following equations:

$$N_{SLTN} = \text{Niveau Sonore Lent Total Normalisé} = \frac{1}{\text{Niveau RefAbsolu}} \sum_{i=1}^{N} N_{SLi}$$

$$N_{SRTN} = \text{Niveau Sonore Rapide Total Normalisé} =$$

$$\frac{1}{\text{Niveau RefAbsolu}} \sum_{i=1}^{N} N_{SRi}$$

The desired volume gain $G_{Volume\ désiré}$ obtained from the correction module 26 is increased by an amplification gain $G_{Lentmax}$ and $G_{Lentmin}$ in the blocks 42 and 44, respectively, then is divided by the standardized total slow sound level $N_{SLTN}$ in division blocks 46 and 48 to obtain, respectively, a maximum slow volume gain denoted $G_{VolLentmax}$ and a minimum slow volume gain $G_{VolLentmin}$. These maximum and minimum slow volume gains correspond to the following expressions:

$$G_{VolLentMax} = \frac{1}{N_{SLTN}} \times G_{lentMax} \times G_{Volumedésiré}$$

$$G_{VolLentMin} = \frac{1}{N_{SLTN}} \times G_{lentMin} \times G_{Volumedésiré}$$

In parallel to the calculations of the maximum slow volume gain and the minimum slow volume gain, a peak volume gain denoted $G_{VolCrête}$ is determined to limit the amplitude of the sound peaks upon retrieval of a high amplitude sound, such as an explosion.

For its calculation, the standardized total slow sound level $N_{SLTN}$ is multiplied by a maximum peak gain $G_{crêteMax}$ at the block 50.

The maximum peak gain $G_{crêteMax}$ is formed by a multiplication coefficient for example chosen from among two values, one corresponding to a nighttime mode, in which the maximum peak gain $G_{crêteMax}$ is small, making it possible to reduce sound peaks, and the other corresponding to a daytime level, in which the maximum peak gain $G_{crêteMax}$ is large, thus making it possible to allow the reproduction of high amplitude sound peaks.

A block 52 sees to the calculation of an amplitude expansion coefficient of the sound levels of the slow signals with respect to the levels of the fast signals. This coefficient is formed by the quotient of the standardized total slow sound level $N_{SLTN}$ multiplied by the maximum peak gain $G_{CrêteMax}$ divided by the standardized total fast sound level $N_{SRTN}$.

At the output of the block 54, the peak volume gain $G_{CrêteMax}$ is determined as the minimum between the value 1 and the extension coefficient from the block 52. Thus, the peak volume gain $G_{Crêtemax}$ satisfies the following expression:

$$G_{VolCrête} = \min\left(1, \frac{G_{crêteMax} \times N_{SLTN}}{N_{SRTN}}\right)$$

To calculate the applied volume gain $G_{volume\ appliqué}$, a block 60 obtains the product between the peak volume gain $G_{VolCrête}$ previously calculated and a slow volume gain $G_{Volume\ Lent}$ calculated from the maximum slow volume gain $G_{VolLentmax}$ and the minimum slow volume gain $G_{VolLentMin}$, as well as the desired volume gain $G_{Volume\ désiré}$ from the control member 26.

To that end, the desired volume gain $G_{Volume\ désiré}$ is multiplied by a maximum volume gain noted $G_{maxVolume}$ in a block 72.

A first block 74 determines the minimum between the desired volume gain $G_{volume\ désiré}$ and the maximum slow volume gain $G_{VolLentMax}$.

A second block 76 determines the minimum between the desired volume gain $G_{Volume\ désiré}$ multiplied by the maximum volume gain $G_{maxvolume}$ and the minimum slow volume gain $G_{VolLentMin}$.

The maximum between these two obtained minimum values is determined by a block 78 to form a slow volume gain $G_{volume\ Lent}$. Thus, the volume gain satisfies the following expression:

$$G_{VolumeLent} = \max\begin{pmatrix} \min(G_{Volumedésiré}, G_{VolLentMax}), \\ \min(G_{maxvolume} \times G_{Volumedésiré}, G_{VolLentMin}) \end{pmatrix}$$

Lastly, the applied volume gain is provided at the output of the block 60 by the following expression:

$$G_{Volume\ appliqué} = G_{VolCrête} \times G_{Volume\ Lent}$$

It will be understood that the slow volume gain $G_{Volume\ Lent}$ makes it possible to keep the sound level between the desired high and low limits set via gains $G_{LentMax}$ and $G_{LentMin}$ in the blocks 42 and 44, respectively. Indeed, for an excessively high sound level, the slow volume gain $G_{Volume\ Lent}$ assumes the value given by $G_{VolLentmax}$, which is even smaller when the sound level is too high. Conversely, if the sound level is too low, the slow volume gain $G_{Volume\ Lent}$ assumes the value given by $G_{VolLentmin}$ within the limit of the gain given by $G_{maxVolume} \times G_{Volume\ désiré}$ in order to limit the volume gain relative to $G_{Volume\ désiré}$ to a desired maximum value.

The invention claimed is:

1. A method for producing a volume gain to be applied by an amplifier to at east one audio signal, according to a desired volume gain selected by a user, comprising:
   calculating a standardized total slow sound level from the at least one audio signal;
   calculating a maximum slow volume gain and a minimum slow volume gain as the quotient of the product of the desired volume gain by a maximum slow gain, respectively by a minimum slow gain, divided by the standardized total slow sound level;
   determining a first minimum volume gain out of the desired volume gain and the maximum slow volume gain;
   determining a second minimum volume gain out of the desired volume gain multiplied by a maximum volume gain and the minimum slow volume gain;
   determining, as a slow volume gain, the maximum of the first and second determined minimum volume gains; and
   calculating the volume gain according to the slow volume gain,
   wherein the method is implemented by a volume management unit together with a device for producing the volume gain, wherein the desired volume gain is obtained from a control member, and wherein the volume gain is applied to the amplifier for its control.

2. The method according to claim 1, wherein calculating the standardized total slow sound level includes, for the at least one audio signal to be reproduced, calculating a slow sound level specific to the audio signal, such as the average of the levels of the audio signal of each source over a long duration.

3. The method according to claim 2, wherein the at least one audio signal includes at least two audio signals to be reproduced, and the standardized total slow sound level is a function of each of the slow sound levels.

4. The method according to claim 2, wherein the long duration is greater than 1 second.

5. The method according to claim 1, wherein the method further comprises calculating peak volume gain, and wherein the calculated volume gain is the product of the slow volume gain multiplied by the peak volume gain having a value lower than or equal to 1 depending on fluctuations of the sound level of the at least one audio signal over a short duration that is shorter than a long duration.

6. The method according to claim 5, wherein the calculation of the peak volume gain further comprises:
   calculating a standardized total fast sound level from the at least one audio signal to be reproduced;
   calculating an expansion coefficient equal to the quotient of the product of the standardized total slow sound level multiplied by a maximum peak gain divided by the standardized total fast sound level; and
   calculating the peak volume gain as the minimum of the expansion coefficient and the value 1.

7. The method according to claim 6, wherein said calculating the standardized total fast sound level includes, for the at least one audio signal, calculating a fast sound level specific to each audio signal.

8. The method according to claim 7, wherein the at least one audio signal includes at least two audio signals to be reproduced, and the standardized total fast sound level is a function of each of the slow sound levels.

9. The method according to claim 5, wherein the short duration is less than 1 second.

10. An amplifier for producing a volume gain to at least one audio signal, according to a desired volume gain selected by a user, comprising:
    a calculator for calculating a standardized total slow sound level from the-at least one audio signal;
    a calculator for calculating a maximum slow volume gain and a minimum slow volume gain as the quotient of the product of the desired volume gain by a maximum slow gain, respectively by a minimum slow gain divided by the standardized total slow sound level;
    a device for determining a first minimum volume gain out of the desired volume gain and the maximum slow volume gain;
    a device for determining a second minimum volume gain out of the desired volume gain multiplied by a maximum volume gain and the minimum slow volume gain;
    a device for determining, as a slow volume gain, the maximum of the first and second determined minimum volume gains: and
    a calculator for calculating the volume gain according to the slow volume gain.

11. The method according to claim 7, wherein the fast sound level specific to each audio signal is the average of the levels of the audio signal of the source over the short duration.

* * * * *